(12) United States Patent
Vemula

(10) Patent No.: US 7,394,721 B1
(45) Date of Patent: Jul. 1, 2008

(54) METHOD AND APPARATUS FOR DATA SYNCHRONIZATION TO LOCAL CLOCK ON MEMORY READS

(75) Inventor: Sunil K. Vemula, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 148 days.

(21) Appl. No.: 11/232,367

(22) Filed: Sep. 20, 2005

Related U.S. Application Data

(63) Continuation-in-part of application No. 11/074,462, filed on Mar. 7, 2005, now Pat. No. 7,196,948.

(51) Int. Cl.
*G11C 7/00* (2006.01)

(52) U.S. Cl. ............... 365/233; 365/191; 365/194; 365/233; 365/189.05; 711/118

(58) Field of Classification Search ............... None
See application file for complete search history.

(56) References Cited

U.S. PATENT DOCUMENTS 6,453,402 B1 * 9/2002 Jeddeloh ............... 711/167

* cited by examiner

*Primary Examiner*—Huan Hoang
*Assistant Examiner*—Michael Weinberg
(74) *Attorney, Agent, or Firm*—Martine, Penilla & Gencarella, LLP

(57) ABSTRACT

A method for reading data from a memory module over a bi-directional bus is provided. The method initiates with writing data into a storage element asynchronously according to a first clock domain. Next, the data is read from the storage element synchronously according to a second clock domain. A microprocessor and a system wherein data is read over a bi-directional bus are included.

12 Claims, 6 Drawing Sheets

METHOD AND APPARATUS FOR DATA SYNCHRONIZATION TO LOCAL CLOCK ON MEMORY READS

CROSS REFERENCE TO RELATED APPLICATIONS

This application is a continuation-in-part of U.S. patent application Ser. No. 11/074,462, now U.S. Pat. No. 7,196,948, filed Mar. 7, 2005, entitled "Method and Apparatus for Data Capture on a Bi-Directional Bus," which is incorporated herein in its entirety by reference.

BACKGROUND

There is an ongoing quest to reduce the amount of time required to capture memory from an external memory module for processing by a microprocessor. At the same time, there is a competing desire to reduce the pin count in order to more efficiently design the integrated circuit chips from on which a memory module or microprocessor may be defined. Thus, some designs utilize a bi-directional bus between the memory module and the microprocessor. On a bi-directional bus, signal voltages may be held at mid-rail, or floating, in order to more efficiently switch the voltage between digital signal states.

However, holding the signal at the mid-rail state may result in voltage swings to zero or one due to noise on the bus. This increased noise makes it challenging for a memory controller to capture valid data on read cycles while avoiding false clocking due to strobe signals sitting at mid-rail when the bus is not being driven. If a storage element of an input first in first out (FIFO) buffer is enabled at an incorrect time, i.e., when a signal is still at mid-rail, false clocking can occur. The false clocking can result in capturing bad data and bad synchronization of the FIFO write pointer.

One attempt to address this shortcoming was the use of asynchronous FIFOs. However, this scheme required the use of complex/custom logic, which occupied valuable chip real estate. In addition, this custom logic further added to the delay of obtaining the requested data.

In light of the foregoing, it is desirable to implement a scheme for an improved data capture technique across a bi-directional bus that guarantees the availability of the correct data by enabling the input capture logic at the correct time to substantially eliminate false clocking issues.

SUMMARY

Embodiments of the present invention provide a scheme for capturing read data through the utilization of a read enable signal. The present invention can be implemented in numerous ways, including as a process, an apparatus, a system, a device, or a method. Several embodiments of the present invention are described below.

In one embodiment, a method for reading data from a memory module over a bi-directional bus is provided. The method initiates with writing data into a storage element asynchronously according to a first clock domain. Next, the data is read from the storage element synchronously according to a second clock domain.

In another embodiment, a microprocessor is provided. The microprocessor includes a memory controller configured to communicate with external memory over a bi-directional bus. Read capture logic configured to propagate a transition of a read enable signal generated by the memory controller in response to a read command issued by the memory controller is included. The read capture logic causes a delay in the transition of the read enable signal, the delay in the transition of the read enable signal accommodating different latencies associated with strobe signals from the external memory received over the bi-directional bus, wherein the transition of the read enable signal indicates valid data is available for sampling over the bi-directional bus. Data read out multiplexor select logic is also included and generates a select signal configured to select data from a storage element having valid data. The select signal is further configured to enable transmission of the data from the storage element having valid data through a multiplexor while preventing transmission of data from other storage elements through the multiplexor.

In yet another embodiment, a system having a programmable delay for reading data across multiple clock domains is provided. The system includes a memory module and a bi-directional bus. A microprocessor reading data from the memory module over the bi-directional bus is included. The microprocessor has a memory controller integrated therein, the memory controller operating according to a memory controller clock domain. The microprocessor includes read capture logic providing a programmable delay accommodating a latency associated with capturing data from the memory module. The read capture logic is configured to propagate a transition of a read enable signal generated by the memory controller according to the programmable delay, wherein the propagation of the transition of the read enable signal occurs across multiple clock domains. The microprocessor further includes data read out multiplexor select logic generating a select signal configured to select data from a storage element having valid data. The select signal further configured to enable transmission of the data from the storage element having valid data through a multiplexor, while preventing transmission of data from other storage elements through the multiplexor.

Other aspects of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION

An invention is described for a system and method for capturing read data from an external memory. It will be obvious, however, to one skilled in the art, that the present invention may be practiced without some or all of these specific details. In other instances, well known process operations have not been described in detail in order not to unnecessarily obscure the present invention.

The embodiments described herein provide for a register programmable delay to set the latency expected for valid data to return to a memory controller after the controller has issued a read command. The delay governs the time at which the input first-in-first-out (FIFO) buffers become enabled to guarantee that all the data will be captured when the strobe signals are valid. By using a falling edge of the earliest possible strobe signal, the technique provides for a full 1.5 clock cycle window minus related system and chip timing skews.

Figure 1:
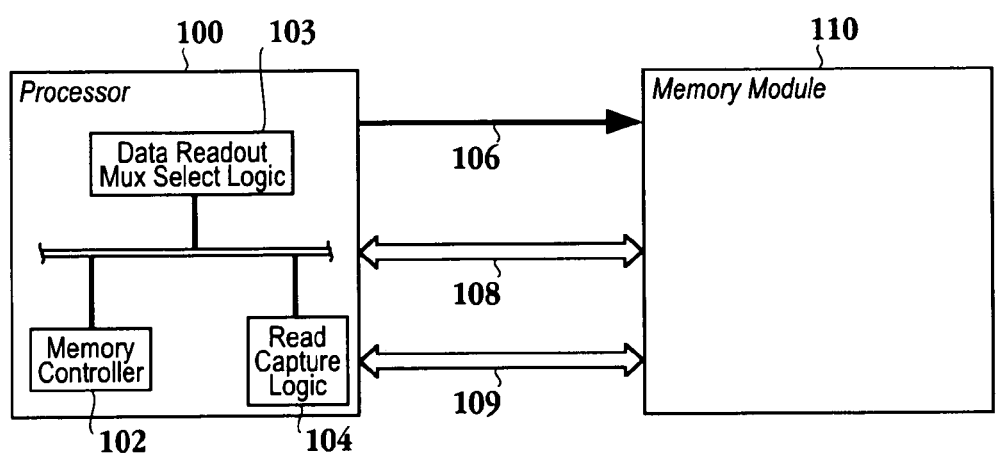
FIG. 1 is a simplified schematic diagram illustrating a system in which a memory controller is able to capture valid data on read cycles while avoiding false clocking due to strobe signals sitting at mid-rail in accordance with one embodiment of the invention.

FIG. 1 is a simplified schematic diagram illustrating a system in which a memory controller is able to capture valid data on read cycles while avoiding false clocking due to strobe signals sitting at mid-rail in accordance with one embodiment of the invention. Processor 100 includes memory controller 102, read capture logic 104, and data read out multiplexor select logic 103. It should be appreciated that while read capture logic 104 and data read out multiplexer logic 103 are shown as separate logic blocks for ease of illustration, the separate logic block may be integrated into a single logic block. Processor 100 is in communication with memory module 110 over unidirectional bus 106, bi-directional bus 108, and bi-directional bus 109. It should be appreciated that unidirectional bus 106 carries command and address information from processor 100 to memory module 110. Bi-directional bus 108 is used to carry a strobe signal between memory module 110 and processor 100. For example, where memory module 110 is a double data rate (DDR) device, data strobes (DQS) are non-free running signals that are driven by the device, which is driving the data signals. Thus, processor 100 drives the DQS for write operations, while the memory module drives the DQS for read operations. Because of the bi-directional nature of bus 108, voltages are held at mid-rail to turn it around faster. In order to prevent a false edge to cause the capture of invalid data the embodiments described herein utilize a read enable signal in which a register programmable delay is set to accommodate the latency for the expected return of valid data. Bi-directional bus 109 carries the corresponding requested data associated with a read command issued by processor 100.

Although processor 100 and memory module 110 may operate at the same frequency, the clock associated with memory module 110 is unlikely to be aligned with the clock of the processor. That is, once a read command issues from processor 100, there is a latency associated with the access of data from memory module 110. This latency may be due to the signal routing through memory module 110 to obtain the requested data for placement on bus 109. In essence, the clock domain of processor 100 is different than the clock domain of memory module 110 because of these latencies. As will be explained in more detail below, the read enable signal mentioned above, is generated by the memory controller and propagated through the read capture logic 104 in a manner that will guarantee valid data being available.

In one embodiment, the memory module is a dual in-line memory module (DIMM). One skilled in the art will appreciate that the DIMM may have a plurality of chips, with each chip generating a strobe signal, i.e., a DQS signal, in response to a read request for data associated with the chip. In another embodiment, there are 18 chips within the DIMM, therefore, 18 different DQS signals may be possible.

Figure 2:
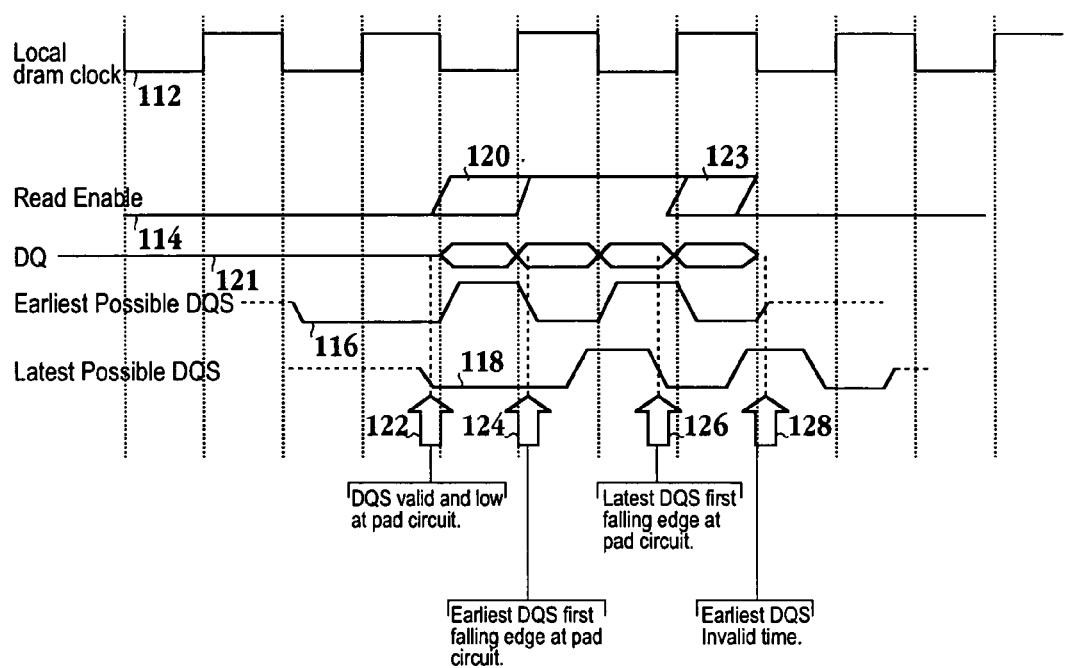
FIG. 2 is a waveform diagram illustrating the timing window capable of being defined through a read enable signal in accordance with one embodiment of the invention.

FIG. 2 is a waveform diagram illustrating the timing window capable of being defined through a read enable signal in accordance with one embodiment of the invention. Waveform signal 112 represents a local memory clock signal for processor 100 of FIG. 1. Read enable signal 114 is generated through the memory controller of the processor. Data strobe signals (DQS) 116 and 118 are driven by the memory module in response to receiving a read request from the processor. Thus, a processor will issue a read command and in response to that read command, the DQS signal is driven from tri-state (mid-rail) to low for a fixed number of cycles. Here, the fixed number of cycles, also referred to as a preamble, is one cycle. However, it should be appreciated that the preamble may be any suitable number of clock cycles. The earliest possible DQS signal 116 represents the shortest length that the signal must travel in order to supply data to be read within memory module 110. The latest possible DQS signal 118 represents the longest length a signal must travel within the memory module. Thus, because of the different lengths in travel, the signals do not arrive simultaneously. In turn, read enable signal 114 is used to guarantee that the storage elements at the input first in, first out (FIFO) buffer are enabled at the correct time. As mentioned above, there may be 18 different DQS signals associated with a DIMM. Therefore, the DQS signals are driven low for the preamble to eliminate noise. The read enable signal is transitioned when an earliest and latest possible DQS signal are guaranteed to be valid.

The difference between the earliest possible DQS signal 116 and the latest possible DQS signal 118 of FIG. 2 represents a worst-case situation, where the latest possible DQS signal is about one clock cycle later than the earliest possible DQS signal. It should be appreciated that if the latest possible DQS signal was moved to the left one cycle and in synchronization with the earliest possible DQS signal, a window of approximately one and a half cycles will be available for transitioning the read enable signal to a high state. However, even in the worst case scenario represented in FIG. 2, a window of approximately a half cycle between the latest possible DQS signal 118 being driven low and the first falling edge of the earliest possible DQS signal is available to transition the read-enable signal to a high state. One skilled in the art will appreciate that the strobe preamble for one clock cycle in which each of DQS signals 116 and 118 are driven low and held may be defined by the Joint Electron Device Engineering Council (JEDEC) double data rate (DDR) specifications. Additionally, by utilizing the first falling edge of the earliest possible DQS signal 116 rather than the first rising edge of the earliest possible DQS signal, an extra half cycle is gained in this design for placing the read enable. This allows for an operating margin that is much more robust, even when considering the use of asynchronous FIFOs.

Still referring to FIG. 2, the data associated with earliest DQS signal 116 is represented by line 121. In one embodiment, where the memory module supports a double data rate, four chunks of data are captured, e.g., one at each edge of the strobe signal. Read enable signal 114 remains low until the strobe signals are guaranteed valid and is transitioned to a high logical state prior to the first falling edge of earliest possible DQS signal 116. Thus, region 120 of signal 114 represents the time range that the read enable signal can transition, i.e., between arrow 122 and arrow 124. Read enable signal 114 remains in a logical high state until after latest possible DQS signal 116. That is region 123 of signal 114 represents the time range that the read enable signal can transition to a logical low state, i.e., between arrows 126 and 128. As illustrated in FIG. 2, the post amble for the strobe signals is one half of a clock cycle, which represents the time period that the signal is maintained in a logical low state before returning to a mid-rail voltage. Read capture logic 104 of FIG. 1, sets a programmable delay that triggers the read enable transition, so that the capture FIFOs are enabled when valid data is available over the DQ bus.

Figure 3:
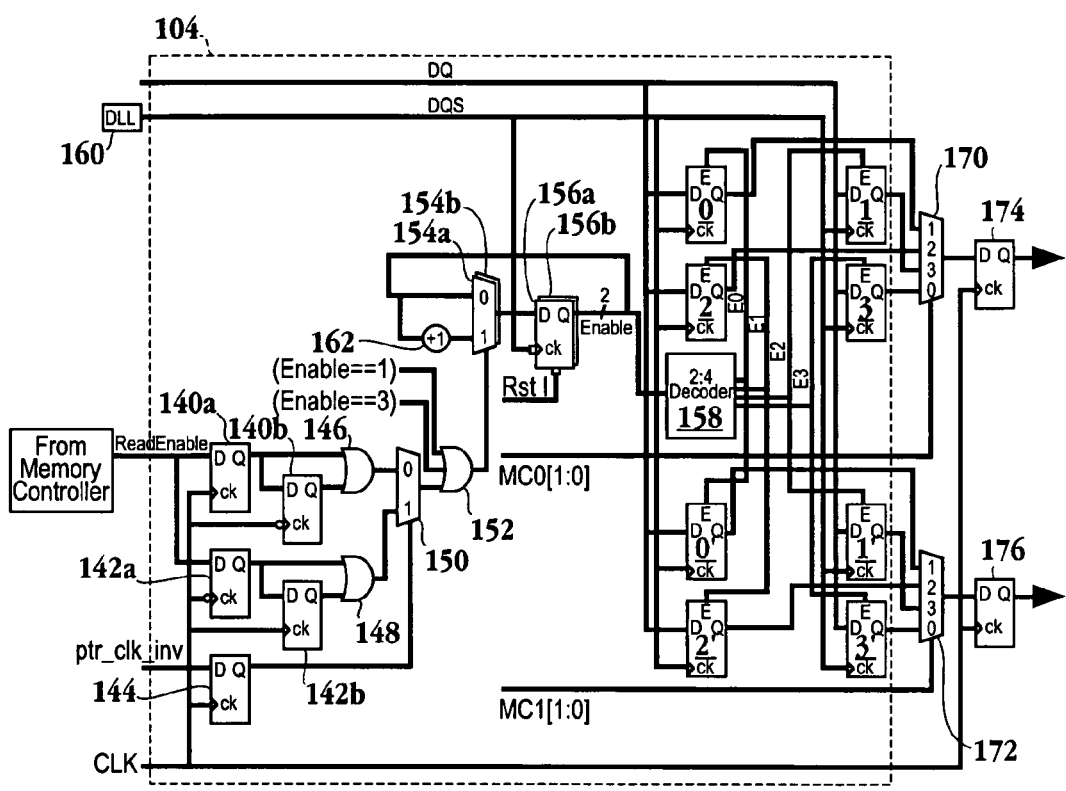
FIG. 3 is a simplified schematic diagram illustrating the structure of the read capture logic in accordance with one embodiment of the invention.

FIG. 3 is a simplified schematic diagram illustrating the structure of the read capture logic in accordance with one embodiment of the invention. The read enable signal from the memory controller is transmitted to storage elements 140a and 142a. The output of storage element 140a is delivered to OR gate 146 and storage element 140b. Storage element 140b eventually supplies a second input to OR gate 146. Likewise, the output of storage element 142a is delivered to OR gate 148 and storage element 142b. The output of storage element 142b is then delivered as an input to OR gate 148. The output of OR gates 146 and 148 are delivered to multiplexor 150. The select signal for multiplexor 150 is the output of storage element 144, which receives a ptr_clk_inv signal as input. Multiplexor 150 delivers its output to OR gate 152, which additionally includes FIFO enable=1 and enable=3 signals as input. The ptr_clk_inv signal is used to program the read enable signal to a half cycle resolution. The FIFO enable signals are incremented when the read enable signal is asserted or when the read enable value is to one or three. The clock signal for the operation described above is the local clock from the memory controller. It should be appreciated that the logic described above makes the read enable signal valid for at least one and a half cycles.

Still referring to FIG. 3, the output of OR gate 152 is used as a select signal for multiplexor 154a. Multiplexor 154a delivers its output to storage element 156a. The output from storage element 156a will be sent to decoder 158 and returned back to multiplexor 154a. As illustrated, the signal is incremented through module 162 in addition to being fed back to multiplexor 154a. The clock signal for storage element 156a is the strobe signal (DQS) from the memory module. One skilled in the art will appreciate that delay lock loop (DLL) 160 functions to center align the skew of the DQS signal to the DQ signal. Decoder 158 will then decode and forward the enable signal to either of the two banks of four storage elements. It should be appreciated that there are two sets of four storage elements, i.e., storage elements 0, 1, 2, and 3 and storage elements 0', 1', 2', and 3', in order to accommodate back-to-back read operations. Thus, multiplexor 154a and 156a are replicated as multiplexor 154b and 156b in order to handle the back-to-back read operations without losing any data. In one embodiment, the counter represented by module 162 is at zero or two until the read enable signal is asserted. This points to enabling the 0 and 0' storage elements, which store data when the DQS signal has a positive and negative transition. Once read enable is asserted the pointer increments thereby enabling the 1 and 1' storage elements to store valid data. It should be appreciated that this counter value is automatically incremented when its value is one or three as the data is in four portions as illustrated with reference to FIG. 2.

In one embodiment, read capture logic 104 allows for timing the read enable signal within one half of a clock cycle through a programmable delay. The read enable signal is eventually issued to increment a pointer within storage elements 156a and 156b. Thus, when the read enable signal has not transitioned to a logical high state, i.e., is not enabled, the pointer is not incremented and will point to a fixed location until valid data is available. For example, the pointer may point to storage element 0 until a valid read enable signal is received, at which time the pointer is incremented to enable each of the four storage elements to receive the corresponding four chunks of data. It should be appreciated that the storage elements described above may be any suitable storage element, such as a flip-flop or a latch. At a later time the controller issues multiplexor select signals to read out the data stored in storage elements 0, 0', 1, 1', 2,2', 3, and 3' in the order written.

Once the data is captured in storage elements 0-3 and 0'-3', the data must be read out. The data from the corresponding storage elements is selected through multiplexors 170 and 172 and corresponding select signals. The embodiments described herein provide further details on how and when to read out of storage elements 0-3 and 0'-3'. The circuitry generating the select signals MC0[1:0] and MC1[1:0] is discussed in more detail with reference to FIG. 5. The selected output from multiplexors 170 and 172 is captured in storage elements 174 and 176, respectively, which are provided to meet timing requirements.

Figure 4:
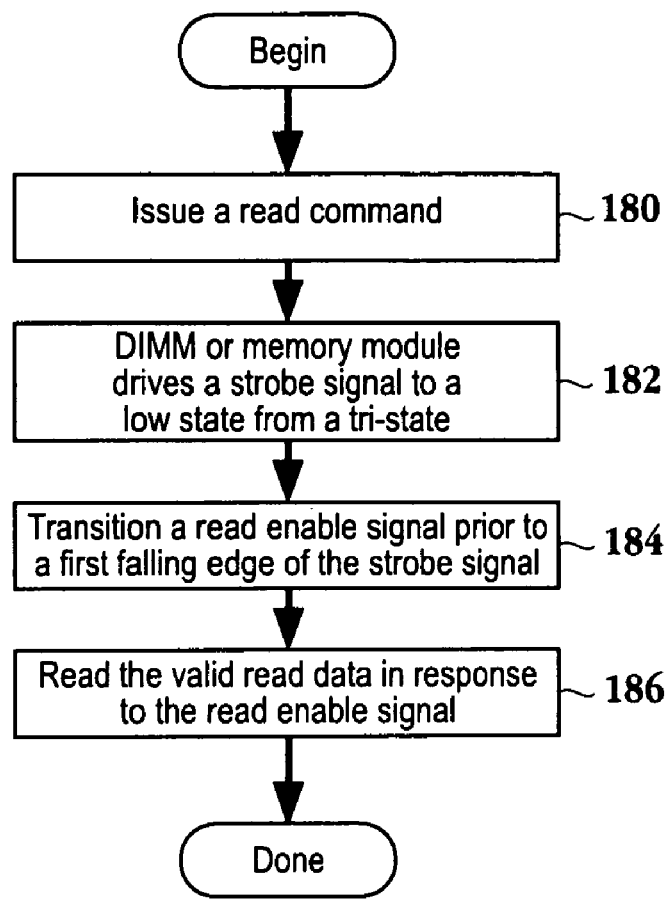
FIG. 4 is a flow chart diagram illustrating the method operations for reading data from a memory module over a bi-directional bus in accordance with one embodiment of the invention.

FIG. 4 is a flow chart diagram illustrating the method operations for reading data from a memory module over a bi-directional bus in accordance with one embodiment of the invention. The method initiates with a read command being issued in operation 180. Here, the read command is issued by a processor, such as, the processor discussed above with reference to FIG. 1. In response to the read command, the DQS signals, also referred to as strobe signals, are driven low from a tri-state for a preamble time frame in operation 182. Here, the DIMM or memory module drives the strobe signal. In one embodiment, the preamble is one clock cycle. The method then advances to operation 184 where a read enable signal is transitioned prior to a falling edge of a strobe signal representing an earliest availability for valid read data being available. By using the falling edge of the earliest available strobe signal, an additional half cycle is gained to define a window during a worst-case situation as represented in FIG. 3. Here, a timing window representing valid read-data being available from the memory module is identified. The timing window is defined by the read enable signal, which is issued as a result of the read command and the first falling edge of the earliest possible DQS signal. The propagation of the read enable signal is delayed through a programmable register delay to accommodate the latency expected for valid data to return to the controller, after the controller has issued a read command. The method then moves to operation 186 where the valid read data is read in response to the read enable signal. With reference to FIG. 3, the read enable signal enables the storage elements to accept the four chunks of data to be eventually read out.

Figure 5:
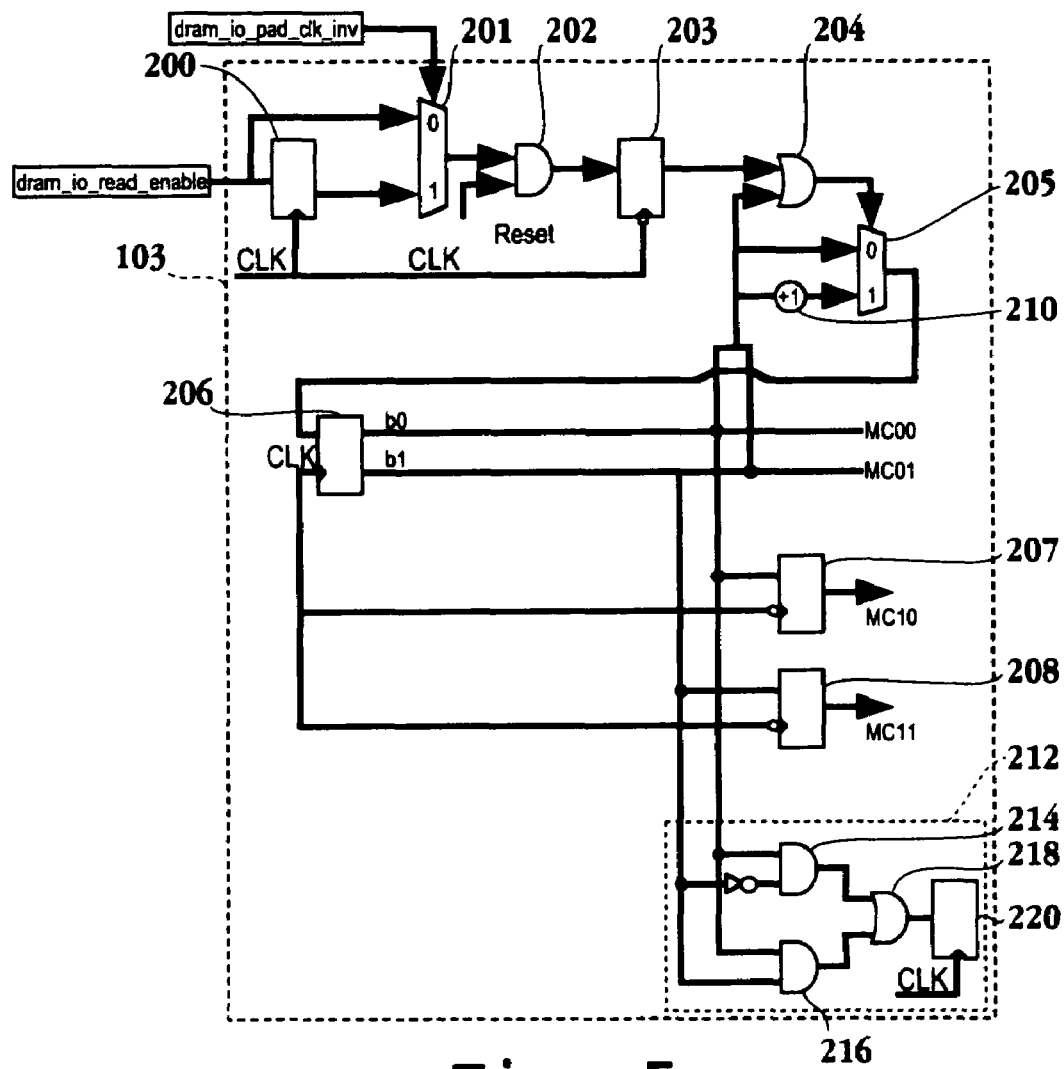
FIG. 5 is a simplified schematic diagram of the data readout multiplexor select logic incorporated into the processor in accordance with one embodiment of the invention.

FIG. 5 is a simplified schematic diagram of the data readout multiplexor select logic incorporated into the processor in accordance with one embodiment of the invention. Data read multiplexor select logic 103 includes storage element 200 that receives the read enable signal where the read enable signal also bypasses storage element 200 and proceeds directly into multiplexor 201. Output of storage element 200 is a second input into multiplexor 201. The select signal for multiplexor 201 is dram_io_pad_clk_inv signal. It should be appreciated that to provide a programmable delay in order to accommodate various differences between the earliest possible and the latest possible DQS signals, this select signal is configured to select between the delayed signal and the bypassed signal delivered to multiplexor 201. The output from multiplexor 201 is fed into AND gate 202. A second input to AND gate 202 is a reset signal, which is provided in one embodiment since storage element 203 is an asynchronous flip flop. The output of AND gate 202 is fed into storage element 203. The output of storage element 203 is provided to OR gate 204. It should be appreciated that the output of storage element 203 is a logical high signal whenever the read enable is asserted, in accordance with one embodiment of the invention. In another embodiment, if the value of the input into OR gate 204 is a 1 or 3 from storage element 206, then the count is automatically incremented to the next value. The output of OR gate 204 is used as a select signal for multiplexor 205. The select signal is used to select between an incremented value of previous counted values or a current bypass value, i.e., the two inputs to multiplexor 205. The output from multiplexor 205 is fed into storage element 206. In one embodiment, storage element 206 functions as a two-bit counter that counts zero to three and outputs bit zero (b0) MC00 and bit one (b1) MC01, which function as the multiplexor select signal MC0[1:0] to multiplexor 170 of FIG. 3. It should be noted that MC00 and MC01 are captured on a positive edge of a clock signal while MC10 and MC11, which correspond to MC1[1:0] of FIG. 3, are captured on negative clock edge.

It should be appreciated that whenever the output of OR gate 204 of FIG. 5 is a logical high value, then the select signal is selecting the value being incremented. As illustrated, module 210 increments the bit value from two-bit counter 206. Storage elements 207 and 208 also function to store values output from two bit counter 206 in order to be eventually utilized as a select signal for corresponding multiplexers within FIG. 3. The circuitry within module 212 generates a signal issued to the memory controller indicating when data is valid to ship from the memory module to a level two cache, where the level 2 cache is requesting the data, in accordance with one embodiment of the invention. The logic includes AND gates 214 and 216, and OR gate 218. As illustrated, the values from storage element 206 are delivered to AND gates 214 and 216 as inputs, where bit b1 is inverted prior to being input to AND gate 214. The outputs of AND gates 214 and 216 are provided as inputs into OR gate 218. The output of OR gate 218 is input to storage element 220. The signal indicating that valid data is ready to ship from the memory module to the level 2 cache is output from storage element 220. It should be appreciated that the clock signal for each of the corresponding logic functions and storage elements is a local clock of the memory controller.

Figure 6:
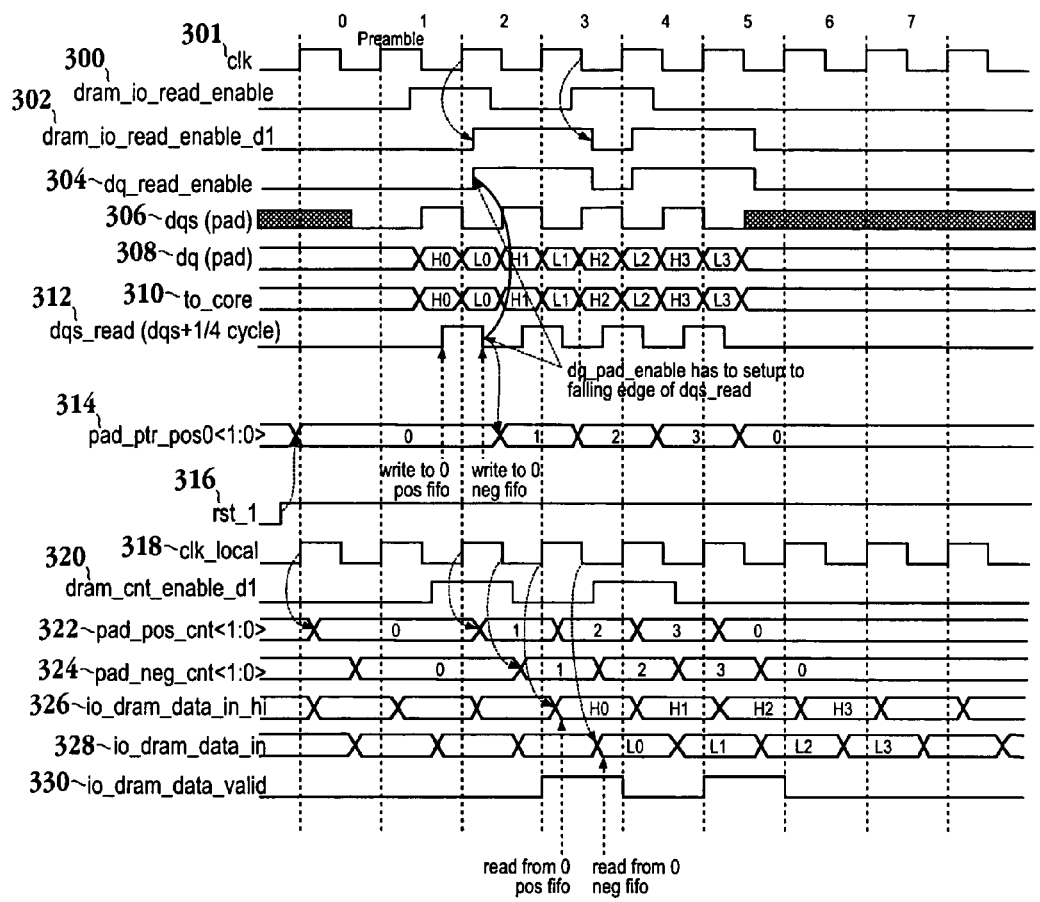
FIG. 6 is a simplified schematic diagram illustrating the timing diagram for performing a read from memory to the processor in accordance with one embodiment of the invention.

FIG. 6 is a simplified schematic diagram illustrating the timing diagram for performing a read from memory to the processor in accordance with one embodiment of the invention. FIG. 6 shows the typical waveforms for READ transactions from memory to the core. The enable signal for writing into the first in first out (FIFO) buffer is delayed by half of a cycle. It should be appreciated that the input DQS is asynchronous to the internal clock. The earliest possible first DQS pulse is determined by the setup time of dq_pad_enable to the first falling edge of dqs_read, which is the clock signal for the write FIFO counter. This insures that data is written properly to the first in, first out buffer. As can be seen, read enable signal 300, which originates from the memory controller, is asserted on a rising edge of clock 301. The dq_read_enable signal 304 sets up to the falling edge of dqs_read signal 312. Reset signal 316 triggers data being written into a first in first out buffer as illustrated by signal 314. Signal 306, dqs (pad) is used to trigger data capture in the core as illustrated by signals 308 and 310. In addition, dq_read_enable signal 304 sets up to a falling edge of signal 312. Based off of clock signal 318, which corresponds to clock signal 301, data is captured in four chunks on the rising and falling edges of clock signal 318. Signal 322 and 324 illustrate the counter values being incremented with each capture of data while signal 326 and 328 illustrate the data being captured on corresponding rising and falling edges of clock signal 318. Signal 330 illustrates the data valid signal, which is issued to the memory controller indicating that valid data is ready to ship from the memory module to a level 2 cache, in one embodiment, as mentioned above.

Continuing with FIG. 6, signal 320, which corresponds to the output of storage element 203 of FIG. 5, is asserted based on the negative edge of clock signal 318. Once signal 320 is asserted, the output of storage element 203 of FIG. 5 is high, so that the incremented value fed into multiplexer 205 is selected. Signal 326 represents the output of storage element 174 of FIG. 3, while signal 328 represents the output of storage element 176.

The embodiments described above provide for a simple digital logic that can be easily designed and validated with standard tool flows as opposed to analog designs previously used for the asynchronous control. This logic will take less area on the silicon, thereby freeing more area for other uses. In addition, by using the falling edge of the earliest available strobe signal, a wider timing window is defined for greater flexibility and system implementation. The design is deterministic and gives better repeatability since it is entirely governed by programmable delays as opposed to sensing voltages. It should be appreciated that the term storage element as used herein may refer to any suitable storage element, e.g., a flip flop, a latch, a FIFO buffer, etc.

In summary, the proposed technique substantially eliminates the capturing of invalid data through the use of a read enable signal. The read enable signal is delayed after a read command is issued in order to guarantee that valid data is captured. Additionally, data read out multiplexor select logic ties the read enable signal to the multiplexor select signals, as illustrated through FIGS. 5 and 6. The delay logic of the data read out multiplexor select logic ensures valid data exists in the storage elements. In one embodiment, the delay of the data read out multiplexor select logic is programmable. Thus, if the difference between the earliest possible DQS signal and the latest possible DQS signal is wide, then the logic can be programmed to accommodate this difference. The embodiments described above provide for writing into storage elements asynchronously at the DQS clock domain, where the DQS domain is asynchronous to the local clock domain, i.e., the memory controller clock domain. Where the embodiments described above are incorporated into the NIAGARA™ processor of the assignee, there are four channels within memory and within each channel there are 144 bits for DQ and 36 bits for DQS. Thus, there are 4 bits of data per DQS signal. Accordingly, there is one multiplexor select logic per channel in this embodiment.

It should be appreciated that while the above embodiments refer to DDR type memory interfaces, the invention is not limited to these embodiments. That is, the embodiments described above may be expanded to any suitable bi-directional Input/Output interface. Additionally, the processor referred to herein may be a general processor or a processor designed for a specific purpose. In one embodiment, the processor is the NIAGARA™ family of processors owned by the assignee.

With the above embodiments in mind, it should be understood that the invention may employ various computer-implemented operations involving data stored in computer systems. These operations include operations requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Embodiments of the present invention can be processed on a single computer, or using multiple computers or computer components which are interconnected. A computer, as used herein, shall include a standalone computer system having its own processor, its own memory, and its own storage, or a distributed computing system, which which provides computer resources to a networked terminal. In some distributed computing systems, users of a computer system may actually be accessing component parts that are shared among a number of users. The users can therefore access a virtual computer over a network, which will appear to the user as a single computer customized and dedicated for a single user.

The above-described invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a communications network.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A microprocessor, comprising:
   a memory controller configured to communicate with external memory over a bi-directional bus;
   read capture logic configured to propagate a transition of a read enable signal generated by the memory controller in response to a read command issued by the memory controller, the read capture logic causing a delay in the transition of the read enable signal, the delay in the transition of the read enable signal accommodating different latencies associated with strobe signals from the external memory received over the bi-directional bus, wherein the transition of the read enable signal indicates valid data is available for sampling over the bi-directional bus; and
   data read out multiplexor select logic generating a select signal configured to select data from a storage element in the read capture logic having valid captured data, the select signal further configured to enable transmission of the data from the storage element having valid data through a multiplexor while preventing transmission of data from other storage elements through the multiplexor, the data read out multiplexor select logic including circuitry configured to generate a signal to the memory controller, the signal indicating valid data is available for transmission from a memory module to a L2 cache.

2. The microprocessor of claim 1, wherein the different latencies associated with strobe signals from the external memory includes an earliest available strobe signal and a latest available strobe signal.

3. The microprocessor of claim 1 wherein the read capture logic includes,
   first and second storage elements configured to receive the read enable signal, the first storage element providing an output signal to a first OR gate and a third storage element, the third storage element providing output to the first OR gate, the second storage element providing an output signal to a second OR gate and a fourth storage element, the fourth storage element providing output to the second OR gate, wherein the read enable signal propagates through the storage elements according to a memory controller clock domain.

4. The microprocessor of claim 3, wherein the read capture logic further includes,
   a first multiplexor receiving an output signal for the first OR gate and an output signal from the second OR gate, wherein an output signal from the multiplexor is received by a third OR gate.

5. The microprocessor of claim 1, wherein the data read out multiplexor select logic includes,
   a first storage element receiving the read enable signal;
   a first multiplexor receiving the read enable signal and output of the first storage element;
   an AND gate receiving output of the multiplexor;
   a second storage element receiving output from the AND gate; and
   a second multiplexor receiving output of a two bit counter, the second multiplexor outputting data to the two bit counter.

6. The microprocessor of claim 4, wherein output from the third OR gate functions as an enable signal for a second multiplexor, the second multiplexor providing input to a fifth storage element, the second multiplexor and the fifth storage element propagating signals according to a strobe signal of the external memory.

7. A system having a programmable delay for reading data across multiple clock domains, comprising:
   a memory module; a bi-directional bus;
   a microprocessor reading data from the memory module over the bi-directional bus, the microprocessor having a memory controller integrated therein, the memory controller operating according to a memory controller clock domain, the microprocessor including read capture logic providing a programmable delay accommodating a latency associated with capturing data from the memory module, the read capture logic configured to propagate a transition of a read enable signal generated by the memory controller according to the programmable delay, wherein the propagation of the transition of the read enable signal occurs across multiple clock domains, the microprocessor further including data read out multiplexor select logic generating a select signal configured to select data from a storage element in the read capture logic having valid captured data, the select signal further configured to enable transmission of the data from the storage element having valid data through a multiplexor while preventing transmission of data from other storage elements through the multiplexor, the data read out multiplexor select logic including circuitry configured to generate a signal to the memory controller, the signal indicating valid data is available for transmission from a memory module to a L2 cache.

8. The system of claim 7 wherein the multiple clock domains include the memory controller clock domain and a strobe signal received from the memory module over the bi-directional bus.

9. The system of claim 7, wherein the read enable signal is utilized to indicate a timing window for reading four data portions over the bi-directional bus.

10. The system of claim 7, wherein a portion of the read capture logic is replicated to accommodate successive read operations.

11. The system of claim 7, wherein the programmable delay guarantees data retrieved according to an earliest possible strobe signal of the memory module and data retrieved according to a latest possible strobe signal of the memory module are both available.

12. The system of claim 7, wherein the data read out multiplexor select logic includes, a first storage element receiving the read enable signal;

a first multiplexor receiving the read enable signal and output of the first storage element;

an AND gate receiving output of the multiplexor;

a second storage element receiving output from the AND gate; and a second multiplexor receiving output of a two bit counter, the second multiplexor outputting data to the two bit counter.

* * * * *